US011284550B2

(12) United States Patent (10) Patent No.: US 11,284,550 B2
Pruefer et al. (45) Date of Patent: Mar. 22, 2022

(54) USE OF PLACEABLE MARKER COMPONENTS FOR A STAGED PLACEMENT OF COMPONENTS ON A CARRIER

(71) Applicant: ASM Assembly Systems GmbH & Co. KG, Munich (DE)

(72) Inventors: Martin Pruefer, Munich (DE); Sylvester Demmel, Bad Aibling (DE)

(73) Assignee: ASM ASSEMBLY SYSTEMS GMBH & CO. KG

( * ) Notice: Subject to any disclaimer, the term of this patent is extended or adjusted under 35 U.S.C. 154(b) by 390 days.

(21) Appl. No.: 16/211,325

(22) Filed: Dec. 6, 2018

(65) Prior Publication Data

US 2019/0200496 A1 Jun. 27, 2019

(30) Foreign Application Priority Data

Dec. 27, 2017 (DE) ..................... 10 2017 131 322.2

(51) Int. Cl.
*H05K 13/08* (2006.01)
*H05K 13/00* (2006.01)
(Continued)

(52) U.S. Cl.
CPC ... *H05K 13/0812* (2018.08); *H01L 21/67144* (2013.01); *H01L 21/681* (2013.01);
(Continued)

(58) Field of Classification Search
CPC ............ H01L 21/67144; H01L 21/681; H01L 21/6838; H05K 13/0015; H05K 13/0061; H05K 13/0406
See application file for complete search history.

(56) References Cited

U.S. PATENT DOCUMENTS 5,862,586 A * 1/1999 Kimura ................ H05K 13/041
29/832
6,516,514 B1 * 2/2003 Pruefer .............. H05K 13/0495
29/832
(Continued)

FOREIGN PATENT DOCUMENTS

CN 105097432 A 11/2015
DE 1437933 * 7/2004
(Continued)

*Primary Examiner* — Minh N Trinh
(74) *Attorney, Agent, or Firm* — Ostrolenk Faber LLP

(57) ABSTRACT

A method and a placement machine for equipping a carrier with components. The procedure includes: (a) positioning of the carrier in a first spatial location within the placement machine, such that components in a first section of the carrier are placeable by a placement head of the placement machine; (b) placement, by means of the placement head, of a multitude of marker components on the carrier in an overlap area of the carrier; (c) transferring of the carrier along a transport direction into a second spatial location within the placement machine, the second spatial location being selected such that components in a second section of the carrier are placeable by the placement head and that the marker components placed in the overlap area are optically detectable by a camera; (d) second optical detection by means of the camera of the marker components placed in the overlap area; and (e) placement of a multitude of components on the carrier in predefined placement positions within the second section, the spatial locations of the placement positions on the carrier depending at least on the result of the second optical detection of the placed marker components.

18 Claims, 4 Drawing Sheets

(51) Int. Cl.
  *H05K 13/04* (2006.01)
  *H01L 21/67* (2006.01)
  *H01L 21/68* (2006.01)
  *H01L 21/683* (2006.01)

(52) U.S. Cl.
  CPC ..... *H01L 21/6838* (2013.01); *H05K 13/0015* (2013.01); *H05K 13/0061* (2013.01); *H05K 13/0406* (2018.08); *H05K 13/0409* (2018.08)

(56) References Cited

U.S. PATENT DOCUMENTS

| | | |
|---|---|---|
| 6,792,676 B2 * | 9/2004 | Haji .................. H01L 21/67144 29/739 |
| 7,943,423 B2 | 5/2011 | Pohl |
| 10,299,386 B2 * | 5/2019 | Pruefer .................... H05K 3/30 |
| 10,629,465 B2 * | 4/2020 | Handlos .................. H01L 24/03 |
| 2012/0015458 A1 * | 1/2012 | Akamatsu ............ H05K 13/021 438/15 |
| 2019/0200496 A1 * | 6/2019 | Pruefer ............. H05K 13/0015 |

FOREIGN PATENT DOCUMENTS

| | | |
|---|---|---|
| DE | 102010015903 A1 | 11/2010 |
| DE | 102015106224 A1 | 10/2016 |
| JP | H04-137599 A | 5/1992 |
| JP | 2008-277772 A | 11/2008 |
| TW | I433619 B | 4/2014 |
| TW | 201642730 A | 12/2016 |

* cited by examiner

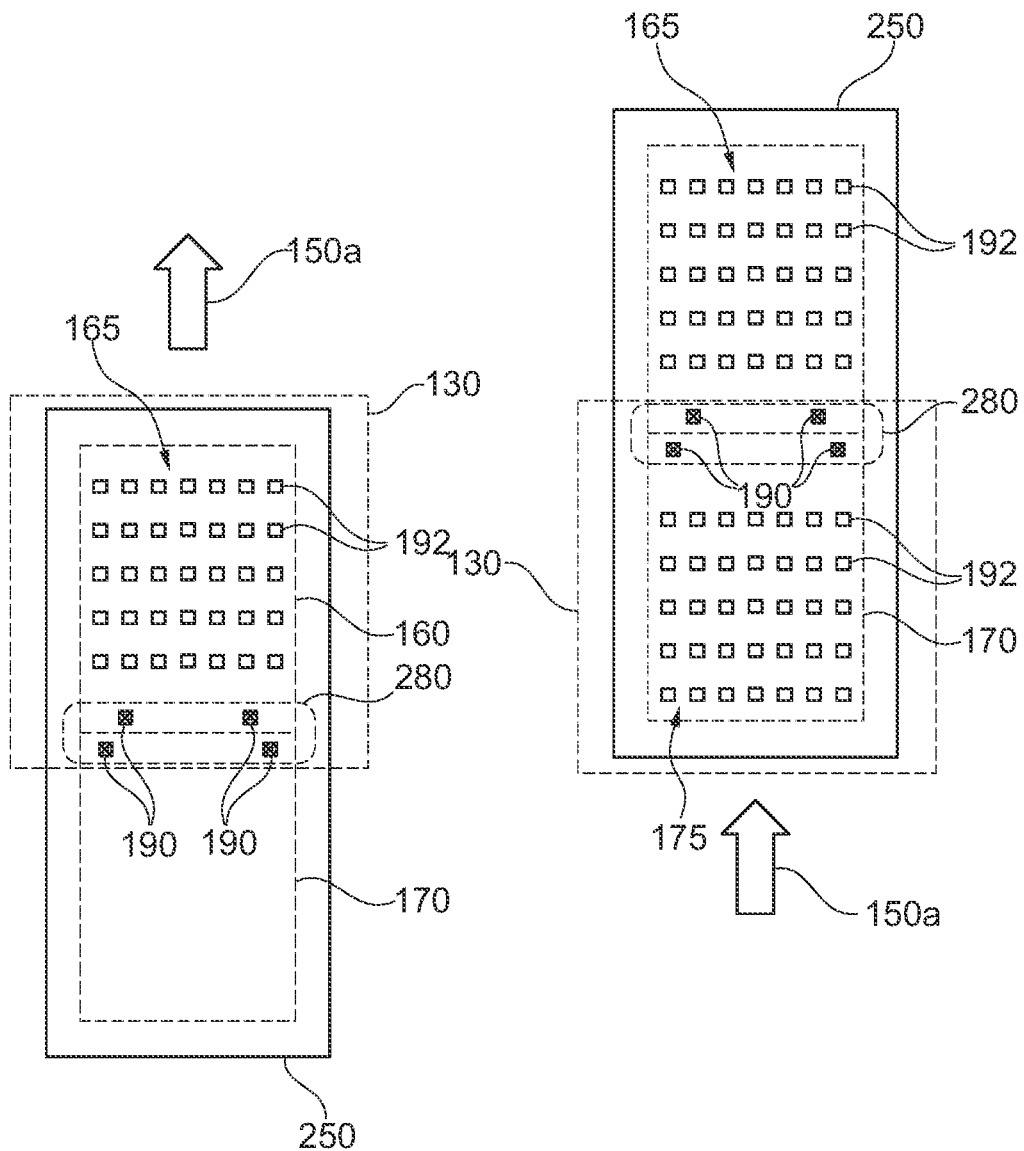

USE OF PLACEABLE MARKER COMPONENTS FOR A STAGED PLACEMENT OF COMPONENTS ON A CARRIER

TECHNICAL FIELD

The present invention relates generally to the technical field of placement technology. The present invention relates particularly to the placement of unhoused electronic components on a carrier for the purposes of producing housed electronic components. In specific terms, the present invention relates to a procedure for placing electronic components on a carrier and a placement machine and a computer programme to execute this procedure.

BACKGROUND OF THE INVENTION

Placement machines have been used for a long time in a known manner for producing electronic modules on circuit carriers. In doing so, the components are positioned by a placement head of the placement machine on the circuit carrier, for example a printed circuit board. On the surface of the circuit carrier, a conducting path structure with suitable component connection surfaces is formed for this purpose. Components for such a surface mounting are also known as SMD (surface mount technology) components. Corresponding placement machines are known as SMD placement machines.

Nowadays, placement machines, particularly SMD placement machines are used with a high output, but also for a large-format placement on carriers in the region of back-end manufacturing or for packaging unhoused chips, for example for so-called "wafer level fan out applications" or "embedded wafer level package" (eWLP) applications. In an eWLP process, one or a number of unhoused components or chips are per package are mounted with the active side upwards or downwards on an adhesive film located on a carrier. A plurality of mounted chips are then sealed with a mass made of plastic, which later represents the housing. The whole encapsulated product is then baked at high pressure and subsequently detached from the carrier or the adhesive film. In the following process steps, electrical contact is then applied to the chips, or they are connected, and solder balls serving as electrical contacts are applied. At the end, the processed encapsulated product as a whole is sawn or otherwise separated into individual housed components.

Generally, the carrier comprises an adhesive film, in particular a so-called thermo-release adhesive film, on which the unhoused electronic components are mounted or placed. Not only unhoused (semiconductor) chips, so-called "bare dies" are used as unhoused components, said chips containing active electronic components or integrated circuits. Passive components can also be used. Furthermore, the requirements on the positional accuracy of the placement are also particularly high in the field of back-end manufacturing. Currently, a positional accuracy or placement accuracy of 10 µm/3σ or more is required, wherein σ (sigma) is the standard deviation for the placement position. Due to the increasing miniaturisation of electronic components, ever higher requirements are expected to be placed on the placement accuracy in the future.

Furthermore, carriers are used in the field of back-end manufacturing, which are considerably larger than typical printed circuit boards and have a format of 650 mm×700 m for example. Carriers of such size permit a positioning of a very high quantity of unhoused components on a single carrier, such that the efficiency of back-end manufacturing is correspondingly high. Currently, machines are known, which place more than 100,000 unhoused components on a single carrier. In the future, this quantity is expected to be even greater.

The carriers used are generally so large or long that they do not fit into the placement area of a typical placement machine. This means that the placement head that is movable by means of a gantry system cannot reach all the possible placement positions on the carrier being equipped. For this reason, carriers of such size must be along a transport direction in the course of a placement process generally lasting a very long period of time. The carrier is thereby moved in a clocked movement through the placement area of the placement machine in question. This means that the carrier is equipped with at least two partial placements, wherein each partial placement is allocated to a section of the carrier. This means that successive different sections of the carrier being equipped (with a certain spatial overlap where necessary) are introduced into the placement area and equipped there with unhoused components. In this context, it is obvious that large or long carriers with at least two sections to be equipped additionally hinder the compliance with a high placement accuracy.

Such a "clocked placement" is also known for a (conventional) placement on long printed circuit boards. As a result, there are at least two positions for the printed circuit board, in which this must be detachably held, in particular clamped, to a chassis of the placement machine. A first position is allocated to a first partial placement of the printed circuit board. In the first position, a first section of the printed circuit board is located in the placement area of the placement machine. In the second position, the second section of the printed circuit board is located in the placement area. After the first partial placement, the printed circuit board located in the first position must be detached, transferred to the second position and fixed there. To have a high positional accuracy or an exact knowledge of the respective position of the printed circuit board, positional markers formed on the printed circuit board are measured in both positions of the printed circuit board by means of a so-called printed circuit board camera.

However, such an optical positional measurement known from placement on long printed circuit boards is not possible for large-format carriers for back-end manufacturing, as the carrier typically has either no positional markers or holes formed on the frame structure of the carrier (for mechanical handling of the carrier) do not have a sufficient optical quality to ensure a highly reproducible and accurate positional measurement with a camera.

The object of the invention is to improve the accuracy of the placement on carriers that are larger than a placement area of a placement machine.

SUMMARY OF THE INVENTION

This object is achieved by the subject matter of the independent claims. Advantageous embodiments of the present invention are described in the dependent claims.

According to a first aspect of the invention, a method is described for the placement of electronic components on a carrier by means of a placement machine and in particular for the placement of unhoused, electronic components on the carrier for the purposes of producing housed electronic components. The method comprises (a) a positioning of the carrier in a first spatial location within the placement machine, such that components in a first section of the carrier are placeable by a placement head of the placement machine; (b) a placement, by means of the placement head, of a multitude of marker components on the carrier in an overlap area of the carrier; (c) a transferring of the carrier along a transport direction into a second spatial location within the placement machine, wherein the second spatial location is selected such that (c1) components in a second section of the carrier are placeable by the placement head and that (c2) the marker components placed in the overlap area are optically detectable by a camera; (d) a second optical detection by means of the camera of the marker components placed in the overlap area; and (e) an equipping of the carrier with a multitude of components at predefined placement positions within the second section. According to the invention, the spatial locations of the placement positions on the carrier depend at least on the result of the second optical detection of the placed marker components.

The described method is based on the knowledge that with a so-called clocked placement on the carrier, during which the carrier is positioned at two different positions within the placement machine and for each position a different section is accessible for the placement head, optically easily detectable structures or marker components, which act as a reference system for an accurate placement of the components during the subsequent placement of the second section with (unhoused) components, are placed within the second section in a subsequent overlap area on the carrier.

Explained in clear terms, a reference of the coordinate system of the two different sections of the carrier is produced by the marker components, wherein each of the two sections can be assigned to a partial placement. The two partial placements can be produced or executed independently of each other. As the marker components are placed like components by the placement head on the carrier, this "coordinate reference" can be produced without the markers that are optically detectable before the execution of the described procedure being found.

With the described method, the first section is assigned to a first placement procedure or a first placement content of components. Correspondingly, the second section is allocated to a second placement method or a second placement content of components. The components can be different (unhoused) components within the first placement content and/or within the second placement content. The components of the first placement content can also differ from the components of the second placement content. The term "different components" can relate to their electronic functionality and/or to the geometry of the body of the components. Unhoused components preferably come from one and the same semiconductor wafer and are therefore preferably unhoused components or chips of the same type.

According to the invention, the overlap area is the subregion of the carrier, which is accessible at least in the first spatial location of the carrier, preferably also in the second spatial location of the carrier, for a placement of components by the placement head. However, it is equally important that this subregion can be detected by the camera both when the carrier is positioned in the first spatial location and when the carrier is positioned in the second spatial location. The marker components must be detectable in both spatial locations. The overlap area is positioned at least partially in the second section.

To allow an altogether efficient placement on the carrier, the overlap area should be located at least partially on an edge of the second section. This means that the overlap area should be as small as possible in terms of a (temporally) efficient placement. On the other hand, the overlap area should be sufficiently large that the marker components (i) can be reliably placed, particularly without a spatial obstruction by the already placed components and (ii) can also be reliably detected by the camera later, i.e. when the carrier is positioned in the second spatial location. The size of the overlap area depends particularly on the spatial distancing between the first spatial location and the second spatial location.

The camera can be a stationary camera in relation to a chassis of the placement machine, which measures the carrier as the medium being equipped. However, the camera is preferably a moveable camera, as is known from conventional placement machines, where such a camera is frequently described as a printed circuit board camera or a "down looking camera", which can be moved within a placement area of the placement machine by means of a gantry system. As a result, this placement area is defined by the entirety of all possible placement positions, which are accessible in the stationary reference system of the placement machine for a placement by the placement head. In particularly preferable exemplified embodiments, the camera is moved by the same gantry system as the placement head and is mounted directly or indirectly on the placement head.

It is noted that the predefined placement positions within the second section can also depend on the (first) positions, at which the marker components were placed when the carrier was (still) in the first spatial location. This can contribute in a simple way to an improvement of the placement accuracy in the second section.

According to an exemplified embodiment of the invention, the method further features a placement of a multitude of components on the carrier in predefined placement positions within the first section when the carrier is positioned in the first spatial location.

The placement on the first section (with a first placement content) can occur before or after the placement of the marker components. In addition, it is possible that the marker components are placed after a partial placement of the first placement content and before a further partial placement of the first placement content. If the marker components are placed before the placement of at least several of the components of the first placement content, then the marker components can also be used as reference markers for an accurate placement of these several components. For this purpose, however, the positions of the placed marker components should be known with a high level of accuracy, so that possible positional errors do not affect the placement accuracy of the components which are being placed using a corresponding reference. The accurate position of the placed marker components can also occur by means of an evaluation at least of one image, which has been recorded of the marker components by the camera.

According to a further exemplified embodiment of the invention, the method further features a first optical detection of the first positions of the placed marker components using a camera of the placement machine, wherein the spatial locations of the placement positions on the carrier are furthermore dependent on the result of the first optical detection of the placed marker components.

The described (additional) first optical detection has the advantage that the positions of the placed marker components can be determined with a particularly high level of accuracy, which is generally greater than the spatial accuracy, with which the marker components can be placed by the placement head. Consideration of the exact positions, at which the marker components were placed, can further increase the placement accuracy in the second section.

According to a further exemplified embodiment of the invention, the method further features a temporary fixing of the carrier directly or indirectly to a chassis of the placement machine, when the carrier is positioned in the first spatial location. Alternatively or preferably in combination therewith, the method further features a temporary fixing of the carrier directly or indirectly to the chassis of the placement machine, when the carrier is positioned in the second spatial location.

The detachable fixation has the advantage that the carrier cannot unintentionally move or slip during the placement of the marker components and optionally also during the placement of components in the first section of the carrier. As a result, a high degree of reliability and in particular a high degree of accuracy of the entire method can be ensured. The same applies for the time periods, in which the second section is equipped with components.

According to a further exemplified embodiment of the invention, the method further features (a) a repeated first optical detection of the first positions of the placed marker components using a camera; (b) a determination, for each marker component, of the first deviation of each between (i) the first position detected in the repeated first optical detection and (ii) the first position recorded in the first optical detection; and (c) a calculation of a spatial warpage of the carrier based on the determined first deviations. This has the advantage that spatial warpages of the carrier, which arise during the placement on the carrier and/or due to a fixation of the carrier, can be recognised and compensated during a subsequent placement of components by a suitable steering of a gantry system that supports the placement head. In addition, one of the target positions allocated to the second spatial location during the transfer of the carrier can depend on the results of the repeated first optical detection.

A warpage during a placement can for example result from the temperature of the carrier changing. This can for example be caused by motors or other components of the placement machine generating heat and this being transferred to the carrier. In view of the typically very high quantity of (unhoused) components and the thereto connected long placement durations, such thermal influences are much stronger in placement machines for unhoused components than in placement robots for housed components.

A warpage caused by a fixation of the carrier results particularly in that fixing elements or clamping elements responsible for the fixation exert a force or pressure at selected positions of the carrier and thereby deform the carrier.

According to a further exemplified embodiment of the invention, the method further features (a) a repeated second optical detection of the second positions of the placed marker components using a camera; (b) a determination, for each marker component, of the second deviation of each between (i) the second position detected in the repeated second optical detection and (ii) the second position recorded in the second optical detection; and (c) a calculation of a spatial warpage of the carrier based on the determined second deviations.

The preceding advantages and explanations mentioned for the repeated first optical detection apply correspondingly for the repeated second optical detection as well.

According to a further exemplified embodiment of the invention, a target position when transferring the carrier, which defines the second spatial location, depends on the first positions of the placed marker components detected by the first optical detection and/or by the repeated first optical detection.

Explained in clear terms, the result of the measurement of the marker components in the first spatial location is included as a correction for a calculation of the target position for the second spatial location. This is then particularly advantageous if the accuracy of the optical detection of the positions of the marker components is greater than the positional accuracy and therefore the actual positions of the marker components. In this case, which regularly occurs, possible placement errors of the previously placed marker components can be largely eliminated.

According to a further exemplified embodiment of the invention, the overlap area of the carrier is located between the first section and the second section. This means that the marker components and the components are placed in different regions on the carrier. The optical detection of the marker components is therefore simplified, because the probability of an inadvertent confusion of a marker component with a component is considerably reduced.

According to a further exemplified embodiment of the invention, the overlap area of the carrier is located both in the first spatial location and in the second spatial location within a placement area of the placement machine. As a result, the placement area is defined by the entirety of all possible placement positions within a stationary coordinate system of the placement machine, wherein the placement positions are all the positions at which components and/or marker components can be mounted on the carrier and also measured by the camera.

This means that the overlap area is not only a part of the second section but also a part of the first section. Thereby, the marker components can be used as reference markers for a placement of both sections with components. As a result, not only can be exact position of the carrier be defined in the second spatial location, but the placement accuracy can also be improved for a placement of components in both sections. However, for the latter, it is necessary that the marker components are placed at a relatively early point during the partial placement in question of the carrier, because the marker components can only be used as reference markers for components which are placed after the placement of the marker components.

According to a further exemplified embodiment of the invention, the spatial extension of the carrier along the transport direction is greater than the spatial extension of the placement area along the transport direction. This means that the carrier, at least along the transport direction, is so long that it cannot be equipped fully with (unhoused) components "in one single placement method", i.e. when the carrier is located in exactly one defined position within the placement machine. The effective placement area of the placement machine in the coordinate system of the carrier, i.e. the area of the carrier which can be equipped with (unhoused) components, is thereby significantly enlarged.

According to a further exemplified embodiment of the invention, the method further features, after the transferring of the carrier into the second spatial location, (a) a placement of a multitude of further marker components on the carrier in a further overlap area of the carrier; (b) a first optical detection of the first positions of the additional placed marker components; (c) a transferring of the carrier along a transport direction into a third spatial location within the placement machine, wherein the third spatial location is selected such that (c1) components in a third section of the carrier are placeable and that (c2) the marker components placed in the overlap area are optically detectable; (d) a second optical detection of the additional placed marker components; and (e) an equipping of the carrier with a multitude of components at predefined placement positions within the third section, wherein the spatial locations of the placement positions on the carrier depend at least on the result of the third optical detection of the placed marker components.

The three-stage placement method described with this exemplified embodiment has the advantage that (in relation to the extension of the placement area along the transport direction) even longer carriers can be equipped with a high degree of accuracy. It is noted that the placement method described in this document can also comprise more than three stages. With an n-stage placement procedure, marker components are placed between two "adjacent stages" for each of N−1 transitions and these are optically detected after a further transferring of the carrier.

It is noted that with a three-stage placement method the further marker components are placed in the second spatial location. The further marker components can be placed with the same placement head as the first marker components or with a different (additional) placement head of the placement machine. In addition, the placement on the carrier in the third section can occur with the same placement head, which was used for placing components on the carrier in the second section. Similar considerations also apply in relation to the camera. This means that both the marker components and the further marker components can be detected with the same camera or alternatively with different cameras.

With an at least three-stage placement method, it can however also be practical if an intermediate first partial placement is initially carried out and based on this intermediate partial placement (including the corresponding marker components) on one side of the first partial placement a second partial placement is carried out and on an opposite side of the first partial placement a third partial placement is carried out. Thereby, undesired error tolerances spreading along a row or chain of partial placements can be advantageously avoided.

According to a further exemplified embodiment of the invention, (a) the first spatial location is assigned to a first placement area of the placement machine, such that the first section of the carrier is equipped in the first placement area and (a) the second spatial location is assigned to a second placement area of the placement machine, such that the second section of the carrier is equipped in the second placement area.

The placement machine can be one single placement robot, having two spatially separated or at least two spatially different placement areas. In this respect, one of the two placement areas of one of two or more placement heads of the placement robot can be assigned to each of the two placement areas, wherein each of the placement heads is preferably moved using its own gantry system.

Alternatively, the placement machine can also be a placement system comprising at least two placement robots, wherein the first placement area is the placement area of a first placement machine and the second placement area is the placement area of the second placement machine. Results of the optical detection of the first positions of the placed marker components can be transmitted by means of a suitable data connection from the first placement robot to the second placement machine.

According to a further exemplified embodiment of the invention, the first section has two first sub-sections, which are spaced apart from each another along a direction perpendicular to the transport direction and to each of which a first partial placement content of components is assigned. Furthermore, the marker components (in the overlap area) are placed within a first gap between the two first sub-sections. This has the advantage that the marker components can be used for subsequent processes. In addition, the marker components can be placed in an area, which is free of (placed) components. Thereby, the marker components and the components are spatially separated from each other, which not only increases the process reliability during placement but also improves the reliability of the detection of marker components. Due to the spatial distancing, any confusion of a marker component with a placed component is virtually excluded.

The placement on the carrier in the two sub-sections can be carried out using a placement head or, particularly in the case of a large placement machine, with a number of placement heads. Thereby, the two placement heads can work staggered in time relative to each other. This means that in a time window when a placement head is mounting components on the carrier, the other placement head is removing components from a component feeding device. In the case of unhoused components, such a feeding device is a system which can accommodate a semiconductor wafer.

According to a further exemplified embodiment of the invention, the second section has two second sub-sections, which are spaced apart from each another along a direction perpendicular to the transport direction and to each of which a second partial placement content of components is assigned. Furthermore, the marker components (in the overlap area) are placed within a second gap between the two second sub-sections.

In this embodiment, the placement on the carrier occurs (preferably in four) placement fields with different placement contents, wherein marker components are placed between each placement field and can be optically detected or measured after a displacement of the carrier along the transport direction. With such a placement, the marker components can be placed between the placement fields or in such a way on the edge of the corresponding section that this has no influence on the respective sub-placement content of the placement fields.

According to a further exemplified embodiment of the invention, at least some of the marker components are produced from an optically transparent material and/or from a semiconductor material. For example, glass, onto which optically detectable structures can be mounted with a (reproducibly) high degree of accuracy, is suitable as the optically transparent material. As the semiconductor material, silicon for example can be used, onto which highly-accurate optically detectable structures can also be mounted, for example by means of etching.

The use of such marker components has the advantage that these can be optically measured with great reliability. This applies particularly when the marker components each have on their surface area an optically easily detectable and highly-accurate structure. Such a structure can for example be produced by means of an etching process. In this exemplified embodiment, all the used marker components are preferably produced in a transparent manner or from a semiconductor material.

It is noted that a good detectability is not only significant when the marker components are detected by a camera after placement. As already mentioned above, such a camera in a conventional placement robot for printed circuit boards is a so-called printed circuit board camera and is a so-called "downward looking camera" in the field of chip bond machines.

However, an optical detection can also occur before the placement of glass components if these are held by the placement head, particularly by means of a suction gripper. Thereby, the exact position of the held glass components can each be determined relative to the placement head and this exact position can be considered for the positioning of the placement head before the placement of the glass components on the carrier. With a conventional placement robot for printed circuit boards, a camera used therefor is called a "component camera".

According to a further exemplified embodiment of the invention, at least some of the marker components are selected components.

In this embodiment, no separate components are used as marker components, which (would) reduce(s) the available placement content in the circumstances. Use of real components can particularly be advantageous when the carrier is equipped with components that are optically easy to detect.

According to a further aspect of the invention, a placement machine is described for the placement of electronic components on a carrier and in particular for the placement of unhoused, electronic components on the carrier for the purposes of producing housed electronic components. The described placement machine comprises (a) a chassis; (b) a transport device for transferring the carrier along a transport direction from a first spatial location into a second spatial location, wherein a first section of the carrier is allocated to the first location for a first placement content and a second section of the carrier is allocated to the second spatial location for a second placement content; (c) a gantry system with a stationary component, which is mounted in a stationary manner to the chassis, and with a moveable component, which can be positioned relative to the stationary component; (d) a placement head, which is mounted on the moveable component and which is configured to pick up components and marker components and after a suitable positioning of the moveable component (d1) equip the carrier with the components at predefined placement positions and (d2) place the marker components on the carrier in an overlap area of the carrier; (e) a camera (e1) for the first optical detection of first positions of the placed marker components, when the carrier is located in the first spatial location, and (e2) for the second optical detection of second positions of the placed marker components, when the carrier is located in the second spatial location; and (f) a control unit for controlling at least the operation of the placement head. The control unit is configured such that the spatial locations of the placement positions within the second section depend on the result at least of the second optical detection of the placed marker components.

The described placement machine is based on the knowledge that the above described placement procedure can be executed with a placement machine, which with regard to its fundamental device-related features (i) corresponds with a known placement machine for unhoused components or chips and (ii) at least approximately corresponds with a known placement robot for equipping printed circuit boards with housed components. To execute the described procedure, it is only necessary to program the control unit in a suitable manner.

It is noted that it is obviously possible to also structurally adjust the placement machine described here in terms of an optimisation of the placement method described here compared with known placement machines or placement robots.

However, this does not change the fact that the fundamental structural features described in this document have the same functions as the corresponding structural features of known placement machines or placement robots.

According to a further exemplified embodiment of the invention, the camera is mounted to the placement head. As a result, the camera can be positioned with regards to its optical detection area such that it can detect or "keep its eye on" the entire overlap area. This has the advantage that even if the placed marker components are located in clearly different positions in relation to the chassis, only one single camera is required. Explained in clear terms, the one camera always moves together with the placement head exactly to where it is needed at that moment.

According to a further aspect of the invention, a computer program is described for the placement of electronic components on a carrier by means of a placement machine and in particular for the placement of unhoused, electronic components on the carrier for the purposes of producing housed electronic components. The computer program is, if it is executed by a processor, set up for performing the above described method.

In the sense of this document, the naming of such a computer program is equivalent to the term of a program element, a computer program product and/or a computer-readable medium containing instructions for controlling a computer system, in order to control the working method of a system or a procedure in a suitable way so as to achieve the effects linked with the method according to the invention.

The computer program can be implemented as computer-readable instruction code in any suitable programming language, such in JAVA, C++, etc. The computer program can be saved on a computer-readable memory device (CD-ROM, DVD, Blu-ray disc, removable drive, volatile or non-volatile memory, built-in memory/processor, etc.). The instruction code can program a computer or other programmable devices, such as for example a control device for a placement machine such that the desired functions are executed. Furthermore, the computer program can be provided in a network, such as the internet for example, from which it can be downloaded by a user when required.

The invention can be realised with a computer program, i.e. software, as well as by means of one or a number of special electronic circuits, i.e. in hardware or another hybrid format, i.e. by means of software components and hardware components.

It is noted that embodiments of the invention have been described in relation to different inventive objects. In particular, some embodiments of the invention are described with device claims and other embodiments of the invention with method claims. However, when reading this application, it is immediately clear to the person skilled in the art that, if not otherwise explicitly stated, in addition to a combination of features belonging to one type of inventive object, any combination of features belonging to different types of inventive objects is possible.

Further advantages and features of the present invention arise from the following exemplary description of currently preferable embodiments. The individual figures of the drawing of this document should only be viewed schematically and not as true to scale.

BRIEF DESCRIPTION OF THE DRAWINGS

FIGS. 2a and 2b show a two-stage clocking of a carrier through a placement area, wherein, compared with FIGS. 1a and 1b, the overlap area is both a part of the second section and a part of the first section.

DETAILED DESCRIPTION

Figure 1A:
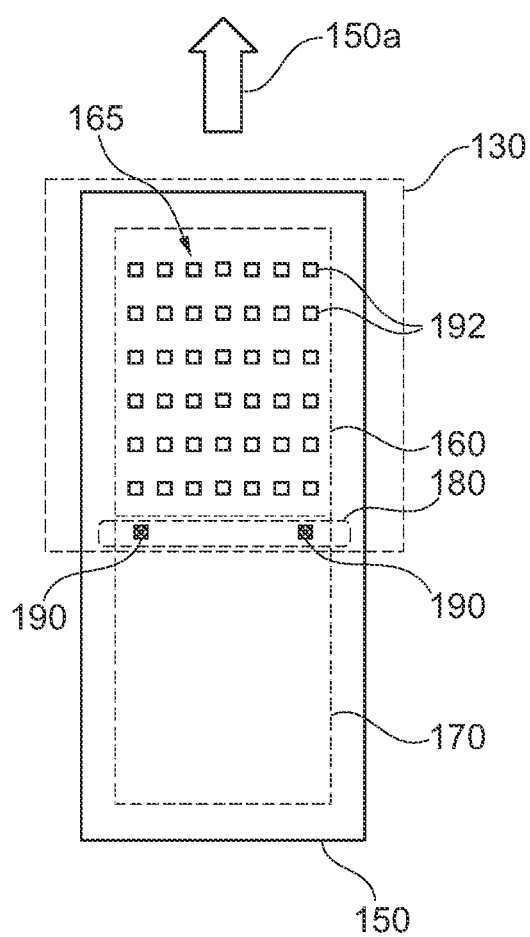
FIGS. 1a and 1b show a two-stage clocking of a carrier through a placement area, wherein the carrier has two sections and one overlap area for marker components, wherein the overlap area is part of the second section.

It is noted that in the following detailed description features or components of different embodiments, which are identical or at least functionally identical to the corresponding features or components of another embodiment, are furnished with the same reference numerals. To avoid unnecessary repetitions, features or components that have already been explained on the basis of a previously described embodiment are no longer explained in detail at subsequent points.

Furthermore, it is noted that the following described embodiments only represent a limited selection of possible variations of embodiments of the invention. In particular, it is possible to combine the features of individual embodiments in a suitable manner, such that a multitude of different embodiments can be viewed as obviously disclosed for the person skilled in the art with the embodiments explicitly described here.

Figure 1B:
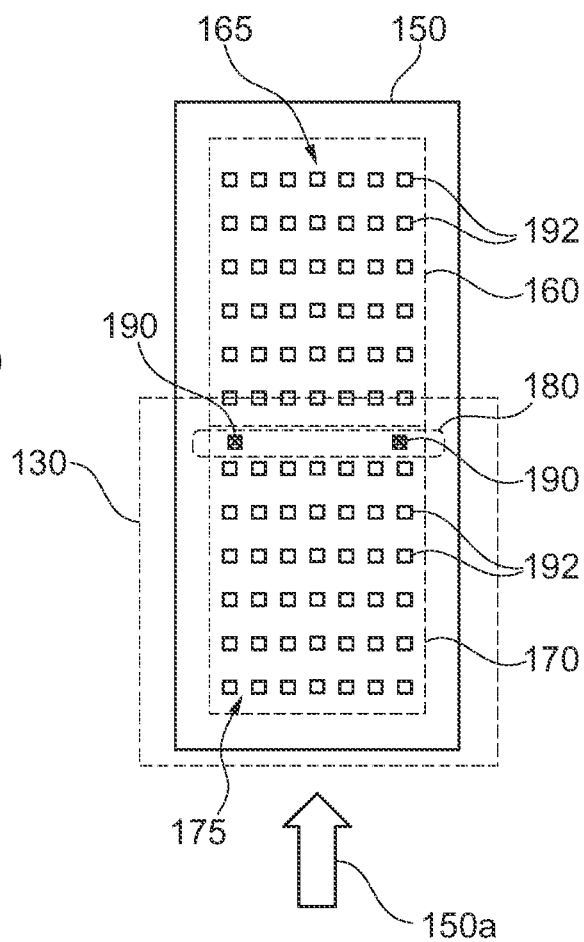

FIGS. 1a and 1b show a two-stage clocking of a carrier 150 through a placement area 130 of a placement machine (not shown). The carrier 150 has two sections, a first section 160 and a second section 170. The first section 160 is provided for a first placement content 165, which is shown in FIG. 1a. The second section 170 is provided for a second placement content 175, which is shown in FIG. 1a and FIG. 1b. The placement contents 165 and 175 comprise respectively a multitude of unhoused electronic components 192.

The staged placement on the carrier 150 thereby begins in that the carrier 150 is positioned relative to the placement area 130 that is stationary in terms of the placement machine such that the first section 160 and an overlap area 180 can be equipped by means of a placement head of the placement machine. The corresponding position of the carrier 150 is also described as the first spatial location of the carrier 150 in this document. As is most clearly visible from FIG. 1a, the overlap area 180 is located in the exemplified embodiment shown here in a front marginal area of the second section 170. According to the exemplified embodiment shown here, the first placement area 160 is (exclusively) equipped with components 192 and the overlap area 180 is (exclusively) equipped with marker components 190.

After the placement of the marker components 190, these are (optionally) detected by a camera (not shown). As a result, the exact positions of the marker components 190 are determined (in the stationary coordinate system of the placement machine). As the accuracy of such an optical position determination is generally higher than the positional accuracy of the placement head, the accuracy of the subsequent placement of the second section 170 is thereby increased. The higher level of accuracy is thus particularly achieved by the use of a shared reference (in the form of the marker components 190).

After completion of the first placement content 165, the carrier 150 is then transferred along a transport direction 150a into a second spatial location. The carrier 150 in this second spatial location is shown in FIG. 1b. In this second spatial location, the second section 170 is accessible to the placement head. In addition, the overlap area 180 is detectable by a camera (not shown) of the placement machine. The overlap area 180 is preferably accessible to both the placement head and the camera in the two spatial locations.

According to the exemplified embodiment shown here, the camera is a camera that is movable by means of a gantry system, which is mounted in particular directly or indirectly to the placement head and is moved together with the placement head.

Before the start of the placement of the second section 170 with the second placement content 175, the marker components 190 are then detected by the camera and their exact positions are determined by means of a data processing unit downstream of the camera. As a result, the (not stationary) reference systems for the first section 160 and the second section 170 can be related to each other such that a (seamless) "connecting placement" of the second section 170 can be made on the already performed placement of the first section 160 with the first placement content 165.

FIGS. 2a and 2b show a two-stage clocking of a carrier 250 through a placement area 130, wherein, compared with FIGS. 1a and 1b, an overlap area 280 is both a part of the second section 170 and a part of the first section 160. Even if in doing so some placement surface on the carrier 250 is "wasted" for the placement with marker components 190, this embodiment can be advantageous due to the symmetry of the location of the overlap area 280 in relation to the two sections 160 and 170. In addition, it is noted that it is also possible that components are also placed in the overlap area 280 next to the marker components 190, such that the "placement surface wastage" is not so great. In addition, the marker components 190 in other exemplified embodiments are selected (unhoused) electronic components, the structures of which are easily detectable for the camera.

Figure 3:
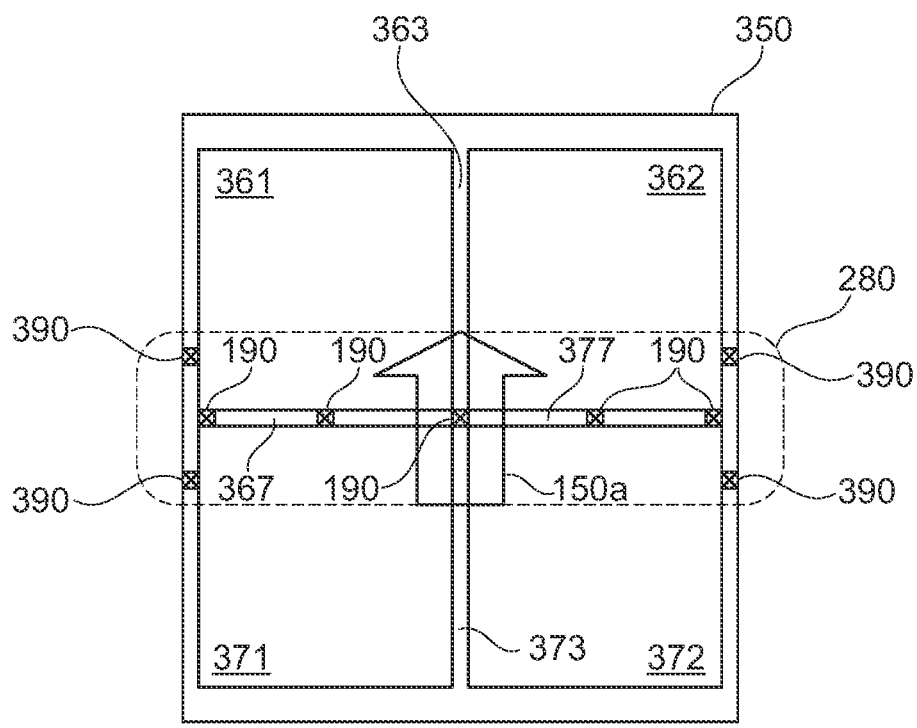
FIG. 3 shows a carrier, whereby the two sections are separated perpendicular to a transport direction respectively into two sub-sections and whereby the marker components are placed in gaps between the sub-sections.

FIG. 3 shows a carrier 350, whereby the two sections are separated respectively into two sub-sections compared to the carrier 150 and 250. In tangible terms, according to the exemplified embodiment shown here, the first (front in relation to the transport direction 150a) section is separated perpendicular to the transport direction 150a into two first sub-sections 361 and 362. Between the two first sub-sections 361 and 362, there is a first gap 363. Accordingly, the second (rear) section is also separated perpendicular to the transport direction 150a into two second sub-sections 371 and 372. Between the two second sub-sections 371 and 372, there is a first gap 373. In addition, the first sub-sections 361 and 362 are spaced apart from the two second sub-sections 371 and 372 along the transport direction 150a by a third gap 367 or a fourth gap 377. Overall, the two first sub-sections 361 and 362 together with the two second sub-sections 371 and 372 form a four-sided arrangement consisting of a total of four sub-sections 361, 362, 371 and 372. Obviously, more than four and in principle any number of sub-sections can be used.

According to the exemplified embodiment shown, the marker components 190 are placed in the area of the third gap 367 and the fourth gap 377, which are positioned within the overlap area 280. As is visible from FIG. 3, a marker component 190 is located in the centre on the carrier 350 (in the intersection between the gaps 363 and 373 on one side and the gaps 367 and 377 on the other side).

Furthermore, in the exemplified embodiment shown here, two marker components 390 are placed at the marginal area of the carrier 350, displaced along the transport direction 150a (but still in the overlap area 280). This has the advantage that not all marker components along the transport direction 150a are placed at the same height or at the same coordinate. As a result, the pattern of marker components 190, 390 detected by the camera is a two-dimensional pattern, which improves the accuracy of the positional measurement. In addition, warpages of the carrier 350 along the transport direction, which are caused during transportation between the two spatial locations and/or by mechanical clampings of the carrier 350 in the two spatial locations, can be thereby determined and taken into consideration during the placement on the second section or the two second sub-sections 371 and 372.

Figure 4:
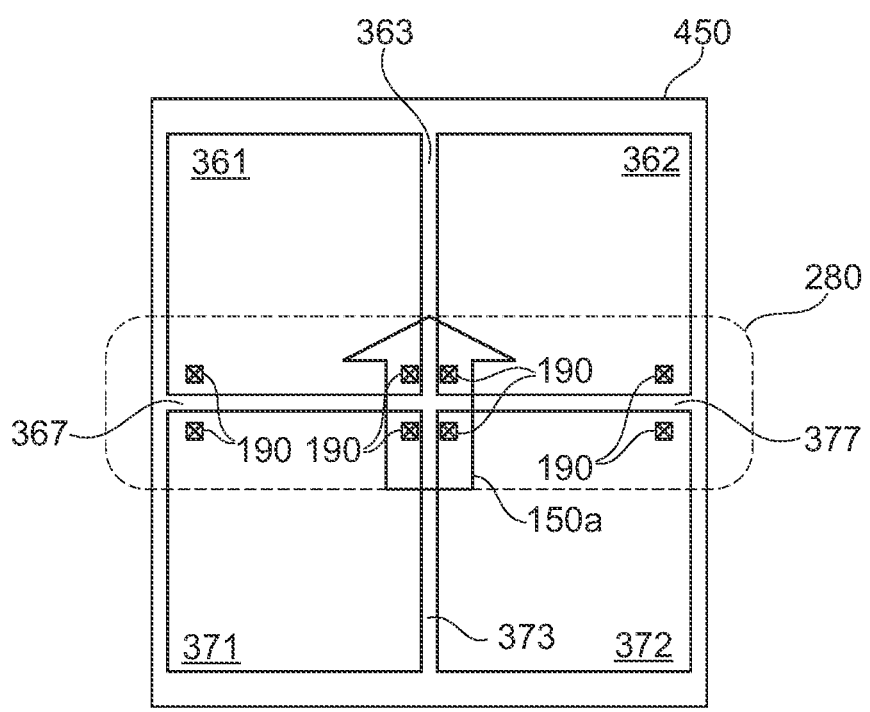
FIG. 4 shows a carrier, whereby in contrast to FIG. 3 the marker components are placed in marginal areas, facing towards each other, of the sub-sections.

FIG. 4 shows a carrier 450, whereby in contrast to the carrier 350, shown in FIG. 3, the marker components 190 are placed in marginal areas, facing towards each other, of the sub-sections 316, 362, 363 and 364. In this exemplified embodiment too, the marker components 190 form a two-dimensional patterns with the above described advantages. The marker components 190 can, as already previously mentioned, also be selected and optically easily detectable unhoused components.

Figure 5B:
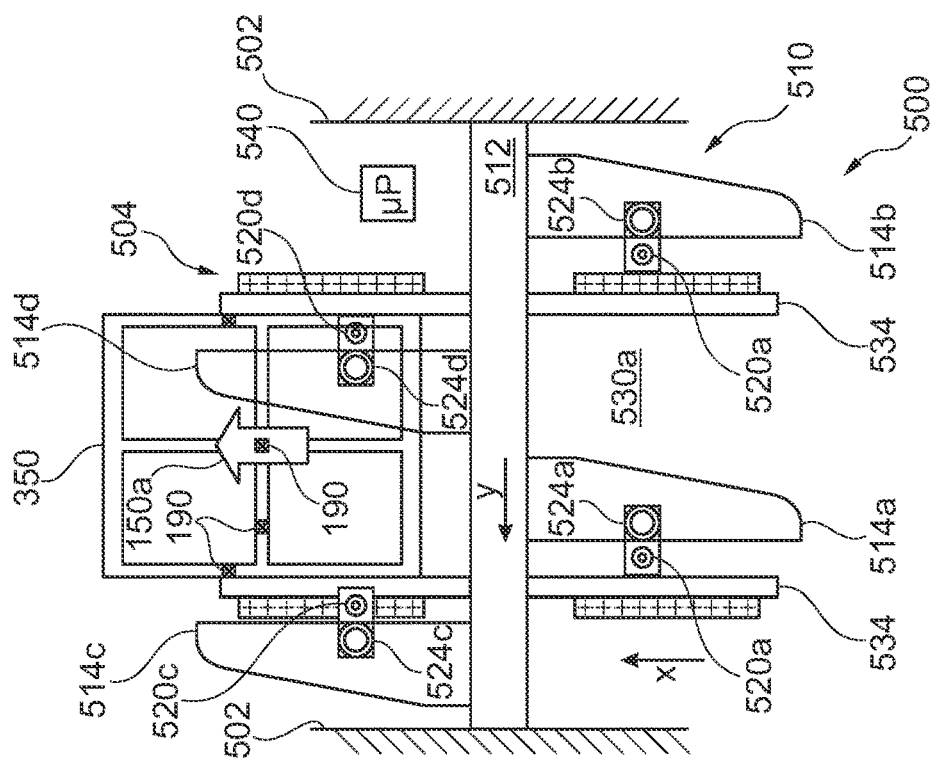
FIGS. 5a and 5b show a two-stage clocking of a carrier with four sub-sections through a placement machine having two placement areas, to which two placement heads are respectively assigned, which work at a time offset to each other.
Figure 5A:
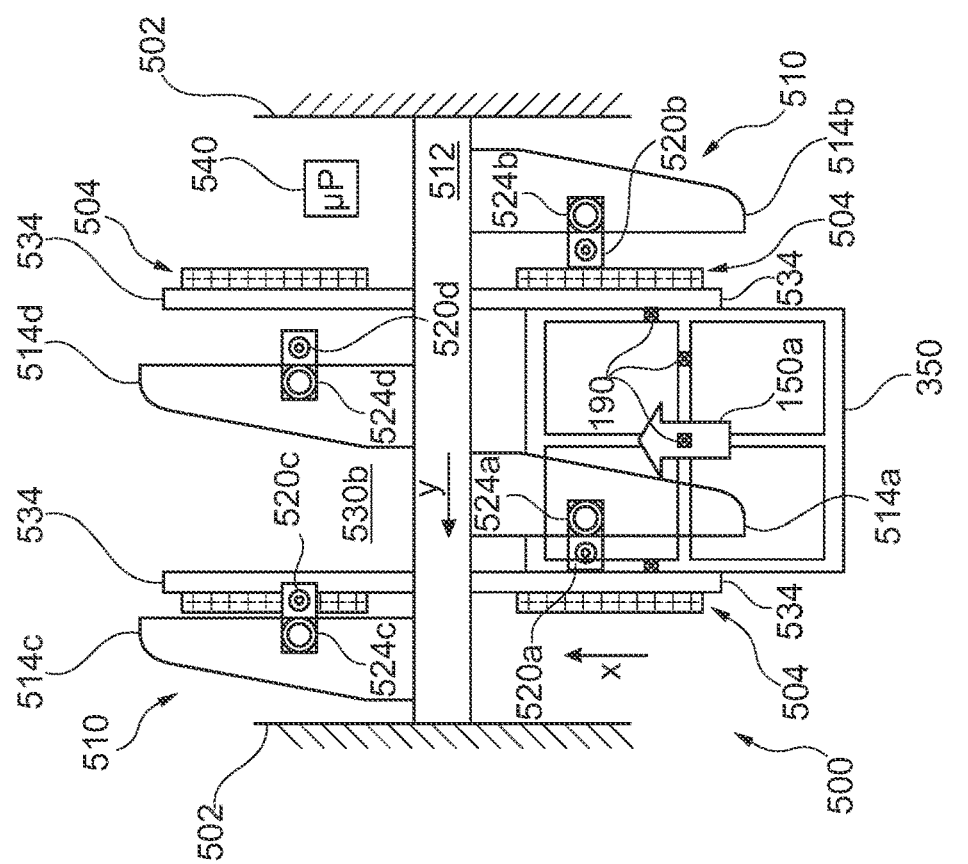

FIGS. 5a and 5b show a two-stage clocking of a carrier 350 with four sub-sections by a placement machine 500. The carrier 350 in a first spatial location is shown in FIG. 5a. The carrier 350 in a second spatial location is shown in FIG. 5b.

The placement machine 500 has a stationary chassis. According to the exemplified embodiment shown here, stationary markers furnished with the reference numeral 504 are directly or indirectly mounted to the chassis in an unshown manner, on the basis of which the positional accuracy of a gantry system 510 is checked in the known manner by an optical reference measurement and the gantry system 510 can be (re)calibrated when necessary.

The gantry system has a stationary component 512, formed as a carrier rail, and a total (in this exemplified embodiment) of four moveable components 514a, 514b, 514c and 514d, formed as transverse carrier arms that are displaceable on the carrier rail 512 along a y-axis. The carrier arms 514a-d extend along an x-direction that is perpendicular to the y-direction. On each of the carrier arms 514a-d, a placement head 520a, 520b, 520c or 520d is attached, which is respectively illustrated by a component holding device formed as a suction gripper. The placement heads 520a-520d are displaceable along the x-direction, such that with each placement head 520a-520d respectively a placement area can be approached. The placement heads 520a-520d can be single placement heads and/or multiple placement heads with a plurality of component holding devices for the temporary removal of a component each.

On each of the carrier arms 514a-d, a camera 524a, 524b, 524c or 524d is further mounted, which can also be displaced along the x-direction, such that at least the corresponding placement areas can be optically detected by the respective camera 524a-d. According to the exemplified embodiment shown here, the cameras 524a-d are displaceable together with the respective placement head 520a, 520b, 520c or 520d.

The clocked placement on the carrier 350 begins then with the carrier 350 being brought along the transport direction 195a in the first spatial location in relation to a first placement area 530a of the placement machine 500, which is located in front of the carrier rail 512 in relation to the transport direction 150a. The reference numeral 530a is only shown in FIG. 5b for reasons of clarity.

The two front sub-sections, relating to the transport direction 150a, of the carrier 350 are placed in the first spatial location. The front sub-sections are furnished with the reference numerals 361 and 362 in FIG. 4. With this placement, the two placement heads 520a and 520b work at a time offset to each other. This means that in a time window when a placement head 520a is mounting components on the carrier 350 (in the two front sub-sections), the other placement head 520b is removing components from a (not shown for reasons of clarity) component feeding device, which is located right of a transportation device 534 in relation to the transport direction 150a. With the unhoused components used here, such a feeding device is a system, which has received a semiconductor wafer, and which, for example using ejector tools, separates individual unhoused component or semiconductor chips from the wafer composite, such that they can be sequentially picked up by the placement head 520b. In a next time window, the placement head 520b places the previously received components and the placement head 520a removes (new) components from a component feeding device located on the left side of the transportation device 534.

Before and during a placement on the two front sub-sections with components, as shown in FIG. 3, marker components 190 are placed by the placement heads in an overlap area of the carrier 350 which is not shown in FIGS. 5a and 5b for reasons of clarity. The exact positions of these marker components 190 are then determined by the camera 524a or 524b.

Thereafter, the carrier 350, as is visible in FIG. 5b, is transferred along the transport direction 150a into a second placement area 530b, such that the carrier is located in a second spatial location in relation to the stationary chassis 502. The second placement area 530b is located behind the carrier rail 512 in relation to the transport direction 150a. The reference numeral 530b is only shown in FIG. 5b for reasons of clarity.

In the second spatial location, the exact positions of these marker components 190 are determined by the camera 524c or 524d. Thereafter, taking into consideration the detected positions, the placement of the two (in relation to the transport direction) rear sub-sections beings, which are furnished with the reference numerals 371 and 372 in FIG. 3. This placement occurs in the same way as the placement of the two front sub-sections (with a staggered operation of the two placement heads 520c and 520d).

The operation of the entire placement machine 500 is coordinated by a control unit 540, which is only shown schematically in FIGS. 5a and 5b and which is furnished with the reference numeral 540. In this control unit, an image evaluation can take place of the images detected by the cameras 524a-d of the marker components 190, in particular.

It is noted that the term "have or comprising" does not exclude other elements and that the word "one or a" does not exclude a plurality. Elements, which are described in connection with different exemplified embodiments, can also be combined. It should also be noted that reference numerals in the claims should not be construed as limiting the scope of the claims.

REFERENCE NUMERALS

130 Placement area
150 Carrier

150a Transport direction
160 First section
165 First placement content
170 Second section
175 Second placement content
180 Overlap area
190 Marker components
192 (Unhoused) components/chips
250 Carrier
280 Overlap area
350 Carrier
361/362 First sub-section
363 First gap
371/372 Second sub-section
373 Second gap
367 Third gap
377 Fourth gap
390 Marker components
450 Carrier
500 Placement machine
502 Chassis
504 Stationary markers
510 Gantry system
512 Stationary component/carrier rail
514a/b/c/d Moveable components/carrier arm
520a/b/c/b Placement head
524a/b/c/d Camera
530a First placement area
530b Second placement area
534 Transport device
540 Control unit

The invention claimed is:

1. A method for placing electronic components on a carrier using a placement machine, the method comprising:
providing the placement machine including a placement head configured to place the electronic components on a carrier;
positioning the carrier in a first spatial location within the placement machine, such that the electronic components are placeable in a first section of the carrier by the placement head of the placement machine;
using the placement head to place a multitude of marker components on the carrier in an overlap area of the carrier, wherein the overlap area lies at least partially in a second section of the carrier;
transferring the carrier along a transport direction into a second spatial location within the placement machine, wherein the second spatial location is selected such that the electronic components are placeable in the second section of the carrier by the placement head and that the marker components placed in the overlap area are optically detectable by a camera;
while the carrier is in the second spatial location, using the camera to optically detect the multitude of marker components placed in the overlap area; and
equipping the carrier with a multitude of electronic components at predefined placement positions within the second section, wherein the locations of the placement positions on the carrier depend at least on a result of the optical detection of the placed marker components.

2. The method of claim 1, further comprising:
equipping the carrier with a plurality of electronic components at predefined placement positions within the first section, when the carrier is located in the first spatial location.

3. The method of claim 1, further comprising:
while the carrier is in the first spatial location, using the camera to optically detect the placement positions of the placed marker components, wherein the locations of the placement positions on the carrier are furthermore dependent on a result of the optical detection of the placed marker components when the carrier is in the first spatial location.

4. The method of claim 1, further comprising:
temporarily fixing the carrier directly or indirectly to a chassis of the placement machine, when the carrier is positioned in the first spatial location; or
temporarily fixing the carrier directly or indirectly to the chassis, when the carrier is positioned in the second spatial location; or
temporarily fixing the carrier directly or indirectly to a chassis of the placement machine, when the carrier is positioned in the first spatial location, and temporarily fixing the carrier directly or indirectly to the chassis, when the carrier is positioned in the second spatial location.

5. The method of claim 1, further comprising:
while the carrier is in the first spatial location, repeatedly using the camera to optically detect the positions of the placed marker components;
determining for each marker component a first deviation of each between the position detected in the repeated optical detection and the position recorded in the optical detection in the first spatial location; and
calculating a spatial warpage of the carrier based on the determined first deviations.

6. The method of claim 5, wherein, in the transferring of the carrier,
a target position, which defines the second spatial location, depends on positions of the placed marker components detected by the optical detection in the first spatial location and/or by the repeated optical detection in the first spatial location.

7. The method of claim 1, further comprising:
while the carrier is in the second spatial location, using the camera to repeatedly optically detect the positions of the placed marker components;
determining, for each marker component, a second deviation of each between the position detected in the repeated optical detection in the second spatial location and the position recorded in the optical detection in the second spatial location; and
calculating a spatial warpage of the carrier based on the determined second deviations.

8. The method of claim 1, wherein:
the placement head is used to place the multitude of marker components on the carrier in the overlap area of the carrier, which is located between the first section and the second section.

9. The method of claim 1, wherein:
the placement head is used to place the multitude of marker components on the carrier in the overlap area of the carrier, which is located both in the first spatial location and in the second spatial location within a placement area of the placement machine, wherein the placement area is defined by the entirety of all possible placement positions on the carrier and within a stationary coordinate system of the placement machine.

10. The method of claim 9, further comprising selecting the carrier such that a spatial extension of the carrier along the transport direction is greater than a spatial extension of the placement area along the transport direction.

11. The method of claim 1, further comprising:
after the transferring of the carrier into the second spatial location,
placing a multitude of further marker components on the carrier in a further overlap area of the carrier;
optically detecting the first positions of the additional placed marker components;
transferring the carrier along a transport direction into a third spatial location within the placement machine, wherein the third spatial location is selected such that:
   (a) the electronic components are placeable in a third section of the carrier; and
   (b) the marker components placed in the overlap area are optically detectable;
optically detecting the additional placed marker components; and
equipping the carrier with a multitude of electronic components at predefined placement positions within the third section, wherein the locations of the placement positions on the carrier depend at least on the result of the optical detection of the placed marker components when the carrier is in the third spatial location.

12. The method of claim 1, wherein:
the first spatial location is assigned to a first placement area of the placement machine, such that the first section of the carrier is equipped in the first placement area; and
the second spatial location is assigned to a second placement area of the placement machine, such that the second section of the carrier is equipped in the second placement area.

13. The method of claim 1, wherein:
the first section has two first sub-sections, which are spaced apart from each another along a direction perpendicular to the transport direction and to each of which a first partial placement content of electronic components is assigned,
at least one marker component is placed within a first gap between the two first sub-sections.

14. The method of claim 13, wherein:
the second section has two second sub-sections, which are spaced apart from each another along a direction perpendicular to the transport direction and to each of which a second partial placement content of electronic components is assigned, and
at least one marker component is placed within a second gap between the two second sub-sections.

15. The method of claim 1, wherein:
at least some of the marker components of the multitude of marker components comprise an optically transparent material and/or from a semiconductor material.

16. The method of claim 1, wherein:
at least some of the marker components are electronic components which are selected to be optically detectable.

17. The method of claim 1, further comprising performing the method with a computer program product that comprises non-transitory computer-executable code residing on a computer-readable medium, the non-transitory computer-executable code causing a control unit to perform the method for the placement of the electronic components on the carrier by means of the placement machine.

18. The method of claim 1, further comprising placing unhoused ones of the electronic components on the carrier to produce housed electronic components.

* * * * *